(12) United States Patent
Stoiber et al.

(10) Patent No.: US 7,889,014 B1
(45) Date of Patent: Feb. 15, 2011

(54) RING BASED IMPEDANCE CONTROL OF AN OUTPUT DRIVER

(76) Inventors: Steven T. Stoiber, 1516 Richardson Ave., Los Altos, CA (US) 94024; Stuart Siu, 20943 Elbridge Ct., Castro Valley, CA (US) 94552

( * ) Notice: Subject to any disclaimer, the term of this patent is extended or adjusted under 35 U.S.C. 154(b) by 0 days.

(21) Appl. No.: 11/986,337

(22) Filed: Nov. 20, 2007

Related U.S. Application Data

(63) Continuation of application No. 10/981,964, filed on Nov. 4, 2004, now Pat. No. 7,330,080.

(51) Int. Cl.
    *H03K 3/03* (2006.01)
(52) U.S. Cl. .............................. 331/74; 331/46; 331/57; 331/176
(58) Field of Classification Search .................. 331/46, 331/57, 74, 176
    See application file for complete search history.

(56) References Cited

U.S. PATENT DOCUMENTS

| | | | |
|---|---|---|---|
| 3,991,380 A | 11/1976 | Pryor | |
| 4,498,021 A | 2/1985 | Uya | |
| 4,739,252 A | 4/1988 | Malaviya et al. | |
| 5,128,560 A | 7/1992 | Chern et al. | |
| 5,166,555 A | 11/1992 | Kano | |
| 5,264,738 A | 11/1993 | Veendrick et al. | |
| 5,297,086 A | 3/1994 | Nasu et al. | |
| 5,337,254 A * | 8/1994 | Knee et al. ..................... | 716/1 |
| 5,394,114 A | 2/1995 | Davis | |
| 5,410,278 A | 4/1995 | Itoh et al. | |
| 5,414,312 A | 5/1995 | Wong | |
| 5,416,861 A | 5/1995 | Koh et al. | |
| 5,455,521 A | 10/1995 | Dobbelaere | |
| 5,467,038 A | 11/1995 | Motley et al. | |
| 5,497,105 A | 3/1996 | Oh et al. | |
| 5,499,214 A * | 3/1996 | Mori et al. .................. | 365/222 |
| 5,525,616 A | 6/1996 | Platt et al. | |
| 5,568,103 A | 10/1996 | Nakashima et al. | |
| 5,594,360 A | 1/1997 | Wojciechowski | |
| 5,677,650 A | 10/1997 | Kwasniewski et al. | |
| 5,680,359 A | 10/1997 | Jeong | |
| 5,698,994 A | 12/1997 | Tsuji | |
| 5,767,700 A | 6/1998 | Lee | |
| 5,791,715 A | 8/1998 | Nebel | |

(Continued)

FOREIGN PATENT DOCUMENTS

| EP | 1398639 | 3/2004 |
|---|---|---|
| JP | 03089624 | 4/1991 |
| JP | 04091516 | 8/1992 |

OTHER PUBLICATIONS

Chen, G., et al., "Dynamic NBTI of P-MOS Transistors and Its Impact on MOSFET Scaling"; IEEE Electron Device Letters, 2002.

(Continued)

*Primary Examiner*—Robert Pascal
*Assistant Examiner*—James E Goodley

(57) ABSTRACT

One embodiment in accordance with the invention is a method that can include utilizing a ring oscillator module to determine a process corner of an integrated circuit as fabricated that includes the ring oscillator module. The impedance of an output driver of the integrated circuit can be altered based on the process corner of the integrated circuit as fabricated.

27 Claims, 8 Drawing Sheets

U.S. PATENT DOCUMENTS

| | | | |
|---|---|---|---|
| 5,796,313 A | 8/1998 | Eitan | |
| 5,811,983 A | 9/1998 | Lundberg | |
| 5,880,608 A | 3/1999 | Mehta et al. | |
| 5,963,074 A | 10/1999 | Arkin | |
| 5,969,543 A | 10/1999 | Erickson et al. | |
| 5,977,763 A | 11/1999 | Loughmiller et al. | |
| 5,982,211 A | 11/1999 | Ko | |
| 6,011,403 A | 1/2000 | Gillette | |
| 6,025,738 A | 2/2000 | Masleid | |
| 6,028,490 A | 2/2000 | Komatsu | |
| 6,031,403 A | 2/2000 | Gersbach | |
| 6,087,886 A | 7/2000 | Ko | |
| 6,114,840 A | 9/2000 | Farrell et al. | |
| 6,114,914 A | 9/2000 | Mar | |
| 6,127,872 A | 10/2000 | Kumata | |
| 6,154,099 A | 11/2000 | Suzuki et al. | |
| 6,154,100 A | 11/2000 | Okamoto | |
| 6,172,545 B1 | 1/2001 | Ishii | |
| 6,172,943 B1 | 1/2001 | Yuzuki | |
| 6,188,260 B1 | 2/2001 | Stotz et al. | |
| 6,204,710 B1 | 3/2001 | Goetting et al. | |
| 6,229,747 B1 | 5/2001 | Cho et al. | |
| 6,242,936 B1 | 6/2001 | Ho et al. | |
| 6,242,937 B1 | 6/2001 | Lee et al. | |
| 6,262,601 B1 | 7/2001 | Choe et al. | |
| 6,281,706 B1 | 8/2001 | Wert et al. | |
| 6,321,282 B1 | 11/2001 | Horowitz et al. | |
| 6,400,230 B2 | 6/2002 | Fairbanks | |
| 6,407,571 B1 | 6/2002 | Furuya et al. | |
| 6,426,641 B1 | 7/2002 | Koch et al. | |
| 6,455,901 B2 | 9/2002 | Kameyama et al. | |
| 6,476,632 B1 | 11/2002 | La Rosa et al. | |
| 6,489,796 B2 | 12/2002 | Tomishima | |
| 6,535,014 B2 | 3/2003 | Chetlur et al. | |
| 6,538,471 B1 | 3/2003 | Stan et al. | |
| 6,538,522 B1 | 3/2003 | Aipperspach et al. | |
| 6,538,957 B2 | 3/2003 | Magoshi | |
| 6,545,519 B1 | 4/2003 | Carballo | |
| 6,570,407 B1 | 5/2003 | Sugisawa et al. | |
| 6,573,777 B2 | 6/2003 | Saint-Laurent et al. | |
| 6,577,157 B1 | 6/2003 | Cheung et al. | |
| 6,577,176 B1 | 6/2003 | Masleid et al. | |
| 6,621,318 B1 | 9/2003 | Burr | |
| 6,657,504 B1 | 12/2003 | Deal et al. | |
| 6,664,837 B1 | 12/2003 | Oh et al. | |
| 6,690,242 B2 | 2/2004 | Fang et al. | |
| 6,696,863 B2 | 2/2004 | Yamamoto et al. | |
| 6,697,929 B1 | 2/2004 | Cherkauer et al. | |
| 6,724,214 B2 | 4/2004 | Manna et al. | |
| 6,731,140 B2 | 5/2004 | Masleid et al. | |
| 6,731,179 B2 | 5/2004 | Abadeer et al. | |
| 6,759,863 B2 | 7/2004 | Moore | |
| 6,762,966 B1 | 7/2004 | LaRosa et al. | |
| 6,774,734 B2 | 8/2004 | Christensen et al. | |
| 6,798,230 B1 | 9/2004 | Taylor et al. | |
| 6,812,799 B2 | 11/2004 | Kirsch | |
| 6,815,971 B2 | 11/2004 | Wang et al. | |
| 6,815,977 B2 | 11/2004 | Sabbavarapu et al. | |
| 6,831,494 B1 | 12/2004 | Fu et al. | |
| 6,882,172 B1 | 4/2005 | Suzuki et al. | |
| 6,882,238 B2 * | 4/2005 | Kurd et al. | 331/186 |
| 6,885,210 B1 | 4/2005 | Suzuki | |
| 6,903,564 B1 | 6/2005 | Suzuki | |
| 7,038,483 B1 | 5/2006 | Suzuki et al. | |
| 7,053,680 B2 | 5/2006 | Masleid et al. | |
| 7,119,580 B2 | 10/2006 | Masleid et al. | |
| 7,126,365 B2 | 10/2006 | Suzuki | |
| 7,212,022 B2 | 5/2007 | Suzuki | |
| 7,304,503 B2 | 12/2007 | Masleid et al. | |
| 7,315,178 B1 | 1/2008 | Suzuki | |
| 7,336,103 B1 | 2/2008 | Masleid et al. | |
| 7,355,998 B2 | 4/2008 | Briancon et al. | |
| 7,414,485 B1 | 8/2008 | Masleid | |
| 2001/0000426 A1 | 4/2001 | Sung et al. | |
| 2001/0028278 A1 | 10/2001 | Ooishi | |
| 2001/0030561 A1 | 10/2001 | Asano et al. | |
| 2001/0052623 A1 | 12/2001 | Kameyama et al. | |
| 2002/0056016 A1 | 5/2002 | Horowitz et al. | |
| 2002/0178415 A1 | 11/2002 | Saraf | |
| 2003/0057775 A1 | 3/2003 | Yamashita et al. | |
| 2003/0127241 A1 | 7/2003 | Russell et al. | |
| 2003/0160630 A1 | 8/2003 | Earle | |
| 2003/0189465 A1 | 10/2003 | Abadeer et al. | |
| 2003/0231713 A1 | 12/2003 | Masleid et al. | |
| 2004/0044983 A1 | 3/2004 | Dillon et al. | |
| 2004/0104731 A1 | 6/2004 | Vollertsen | |
| 2004/0119501 A1 | 6/2004 | Sabbavarapu et al. | |
| 2004/0119503 A1 | 6/2004 | Jamshidi et al. | |
| 2004/0148111 A1 | 7/2004 | Gauthier et al. | |
| 2004/0257115 A1 | 12/2004 | Bertram et al. | |
| 2005/0184720 A1 | 8/2005 | Bernstein et al. | |
| 2005/0212547 A1 | 9/2005 | Suzuki | |
| 2005/0248368 A1 | 11/2005 | Bertram et al. | |
| 2007/0136707 A1 | 6/2007 | Teig et al. | |

OTHER PUBLICATIONS

Lima T., et al., "Capacitance Coupling Immune, Transient Sensitive Accelerator for Resistive Interconnect Signals of Subquarter Micron ULSI" IEEE Journal of Solid-State Circuits, IEEE Inc. New York, US pp. 531-536.

Nalamalpu, et al., "Boosters For Driving Long OnChip Interconnects-Design Issues, Interconnect Synthesis, and Comparison With Repeaters", Jan. 2002, IEEE Transactions on Computer-Aided Design of Integrated Circuits and Systems, vol. 21, No. 1, pp. 50-62.

Oner et al., "A Compact Monitoring Circuit for Real-Time On-Chip Diagnosis of Hot-Carrier Induced Degradation", Microelectronic Test Structures, Proceedings, IEEE International Conference in Monterey, CA, Mar. 17, 1997-Mar. 20, 1997, pp. 72-76.

Peters, Laura, "NBTI: A Growing Threat to Device Reliability"; Semiconductor International, Mar. 1, 2004; http://www.reed-electronics.com/semiconductor/article/CA386329?industryid=3033.

Reddy, V., et al.; "Impact of Negative Bias Temperature Instability on Digital Circuit Reliability"; 2002 IEEE International Reliability Physics Symposium Proceedings, Dallas, TX, Apr. 7, 2002-Apr. 11, 2002.

Non Final Office Action Dated Feb. 15, 2007; Transmeta 08; U.S. Appl. No. 10/981,964; Patent No. 7330080.

Non Final Office Action Dated Apr. 3, 2006; Transmeta 08; U.S. Appl. No. 10/981,964; Patent No. 7330080.

Notice of Allowance Dated Aug. 16, 2007; Transmeta 08; U.S. Appl. No. 10/981,964; Patent No. 7330080.

Final Office Action Dated Sep. 15, 2006; Transmeta 08; U.S. Appl. No. 10/981,964; Patent No. 7330080.

Non Final Office Action Dated Jan. 2, 2009; Transmeta 08; U.S. Appl. No. 11/322,896.

Notice of Allowance Dated Mar. 20, 2009; Transmeta 08; U.S. Appl. No. 11/322,896.

Notice of Allowance Dated May 18, 2007; Transmeta 08; U.S. Appl. No. 11/322,896.

Notice of Allowance Dated Aug. 8, 2008; Transmeta 08; U.S. Appl. No. 11/322,896.

Notice of Allowance Dated Oct. 15, 2007; Transmeta 08; U.S. Appl. No. 11/322,896.

Notice of Allowance Dated Nov. 21, 2007; Transmeta 08; U.S. Appl. No. 11/322,896.

* cited by examiner

300

350

400

450

500

```
┌─────────────────────────────────────────────┐
│  UTILIZE A NFET RING OSCILLATOR MODULE TO DETERMINE A │
│   NFET PROCESS CORNER OF THE INTEGRATED CIRCUIT AS    │
│   FABRICATED THAT INCLUDES THE NFET RING OSCILLATOR   │
│                       MODULE                          │
│                        502                            │
└─────────────────────────────────────────────┘
                        │
                        ▼
┌─────────────────────────────────────────────┐
│  UTILIZE A PFET RING OSCILLATOR MODULE TO DETERMINE A │
│    PFET PROCESS CORNER OF THE INTEGRATED CIRCUIT AS   │
│  FABRICATED THAT INCLUDES THE PFET RING OSCILLATOR MODULE │
│                        504                            │
└─────────────────────────────────────────────┘
                        │
                        ▼
┌─────────────────────────────────────────────┐
│   ADJUST IMPEDANCE OF AN OUTPUT DRIVER OF THE INTEGRATED │
│    CIRCUIT BASED ON THE NFET PROCESS CORNER AND/OR THE   │
│                  PFET PROCESS CORNER                     │
│                         506                              │
└─────────────────────────────────────────────┘
```

```
┌─────────────────────────────────────────────────────────┐
│  UTILIZE A RING OSCILLATOR MODULE TO DETERMINE A PROCESS│
│    CORNER OF AN INTEGRATED CIRCUIT AS FABRICATED THAT   │
│           INCLUDES THE RING OSCILLATOR MODULE           │
│                           602                           │
└─────────────────────────────────────────────────────────┘
                              │
                              ▼
┌─────────────────────────────────────────────────────────┐
│   ALTER IMPEDANCE OF AN OUTPUT DRIVER OF THE INTEGRATED │
│   CIRCUIT BASED ON THE PROCESS CORNER OF THE INTEGRATED │
│                   CIRCUIT AS FABRICATED                 │
│                           604                           │
└─────────────────────────────────────────────────────────┘
```

RING BASED IMPEDANCE CONTROL OF AN OUTPUT DRIVER

RELATED APPLICATIONS

The present application is a continuation of and claims the benefit of U.S. patent application Ser. No. 10/981,964, filed Nov. 4, 2004, now U.S. Pat. No. 7,330,080 entitled "RING BASED IMPEDANCE CONTROL OF AN OUTPUT DRIVER," naming Steven Stoiber and Stuart Siu as inventors, assigned to the assignee of the present invention. That application is incorporated herein by reference in its entirety and for all purposes.

BACKGROUND

Controlling the impedance of an output driver of a semiconductor chip is desirable in order to minimize the impact of the adverse transmission line effects on the propagated signal. If the impedance is not controlled in this environment, the receiving chip may see a spurious transition and misinterpret the transmitted data.

Existing conventional techniques for controlling the impedance generally fall into one of three categories. The first conventional technique involves centering the design on the typical process corner and then tolerating any process variation. Unfortunately, this technique typically only works for low speed interfaces where the signal is allowed to settle out before sampling. Additionally, this technique often cannot be made to work for higher performance interfaces as process variability can be too great to overcome without resorting to some form of calibration.

The second conventional technique involves using one or more off-chip precision components (e.g., a resistor) on which a calibration loop operates. This technique uses calibration to remove process, temperature, and/or supply voltage sensitivity from one or more parameters in the circuit. The calibration is done using either a digital or analog feedback loop that compares a tunable on-chip component with a corresponding off-chip precision component. The on-chip component matches the off-chip component when calibration is completed. Unfortunately, this technique involves the additional expense of the off-chip precision component (e.g., resistor) along with the greater expense associated with installing that off-chip component onto a circuit board.

The third conventional technique involves using fuses to encode process information. This technique is done by measuring one or more process parameters and then blowing fuses to encode this information. The third technique is a subset of the second technique in the sense that it too is calibrating, but the calibration is usually only run once. Unfortunately, the extra processing step of blowing the fuses during manufacturing can incur additional expense along with reliability issues. For example, it can be difficult to determine if a fuse was successfully blown.

SUMMARY

One embodiment in accordance with the invention is a method that can include utilizing a ring oscillator module to determine a process corner of an integrated circuit as fabricated that includes the diagnostic ring oscillator module. The impedance of an output driver of the integrated circuit can be altered based on the process corner of the integrated circuit as fabricated.

Another embodiment in accordance with the invention is a system that can include an output driver of an integrated circuit along with a ring oscillator module. The integrated circuit includes the ring oscillator module. A module can be coupled to the ring oscillator module and can be for measuring an oscillation frequency of the ring oscillator module. Moreover, a control module can be coupled to receive the oscillation frequency from the module and can be for determining a process corner of the integrated circuit as fabricated based on the oscillation frequency. Furthermore, the control module can be coupled to the output driver and can be for changing the impedance of the output driver based on the process corner of the integrated circuit as fabricated.

Yet another embodiment in accordance with the invention is a method that can include utilizing a N-channel metal-oxide semiconductor field-effect transistor (NFET) ring oscillator module to determine a NFET process corner of an integrated circuit as fabricated that includes the NFET ring oscillator module. Additionally, a P-channel metal-oxide semiconductor field-effect transistor (PFET) ring oscillator module can be utilized to determine a PFET process corner of the integrated circuit as fabricated that includes the PFET ring oscillator module. The impedance of an output driver of the integrated circuit can be adjusted based on the NFET process corner and the PFET process corner.

While particular embodiments in accordance with the invention have been specifically described within this summary, it is noted that the invention is not limited to these embodiments. The invention is intended to cover alternatives, modifications and equivalents which may be included within the scope of the invention as recited by the Claims.

BRIEF DESCRIPTION OF THE DRAWINGS

FIG. 5 is a flowchart of an exemplary method in accordance with embodiments of the invention.

FIG. 6 is a flowchart of another exemplary method in accordance with embodiments of the invention.

DETAILED DESCRIPTION

Reference will now be made in detail to embodiments in accordance with the invention, examples of which are illustrated in the accompanying drawings. While the invention will be described in conjunction with embodiments, it will be understood that these embodiments are not intended to limit the invention. On the contrary, the invention is intended to cover alternatives, modifications and equivalents, which may be included within the scope of the invention as defined by the appended claims. Furthermore, in the following detailed description of embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1:
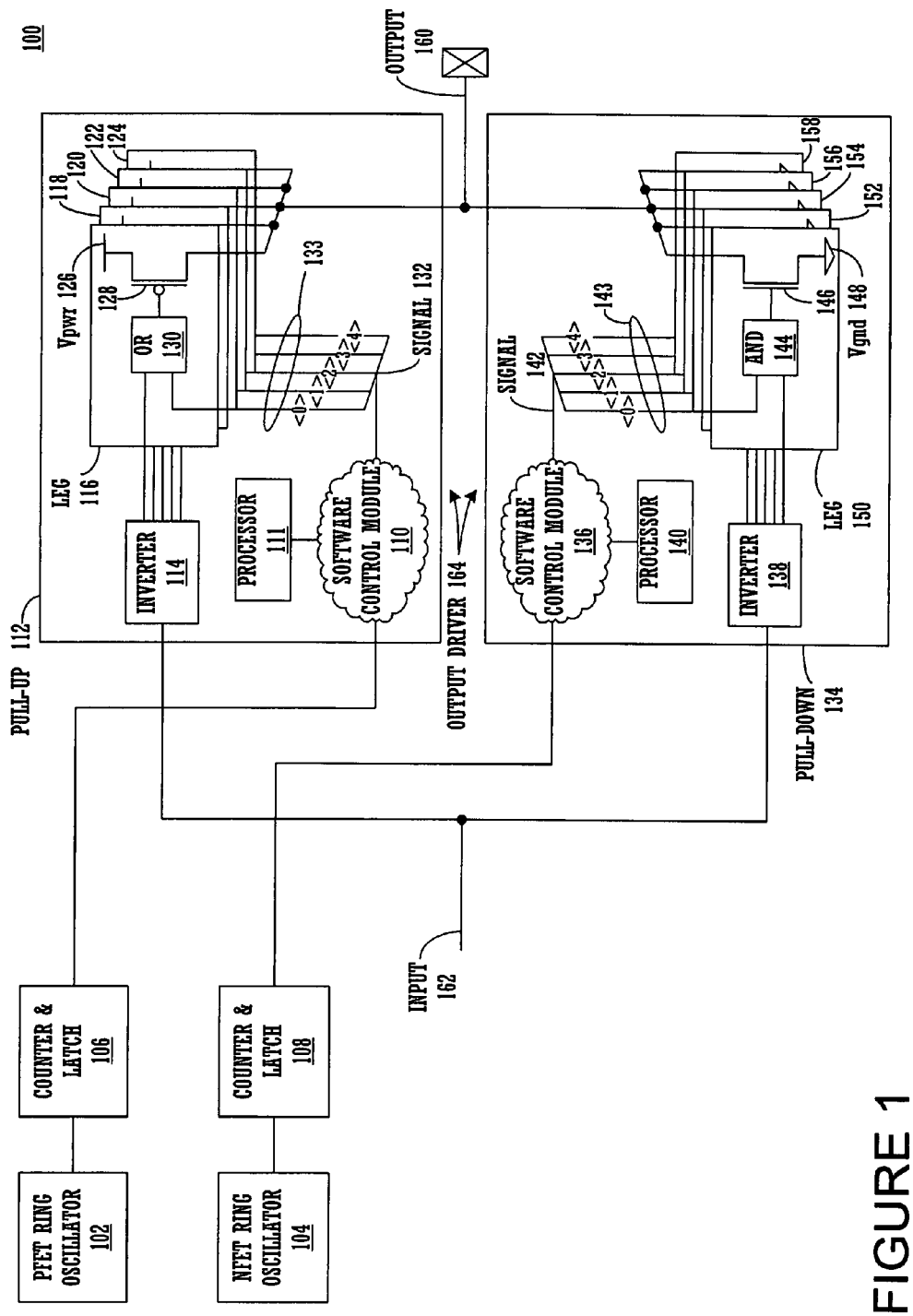
FIG. 1 is a block diagram of an exemplary system for controlling impedance of an output driver in accordance with embodiments of the invention.

FIG. 1 is a block diagram of an exemplary system 100 for controlling impedance of an output driver 164 in accordance with embodiments of the invention. System 100 can read the frequency of each on-chip free running ring oscillators 102 and 104, use this frequency and/or frequencies to determine process corner of the fabricated integrated circuitry of system 100, and then use this process corner information to tune the impedance of the output driver 164. The output driver (or stage) 164 has been implemented to include a five "leg" pull-up structure 112 along with a five "leg" pull-down structure 134. However, pull-up structure 112 and pull-down structure 134 can each be implemented with any number of "legs" greater or less than that shown within system 100. It is appreciated that as each leg is activated within the pull-up structure 112 and/or pull-down structure 134, the inherent impedance of each leg is added to the impedance of the output driver 164.

Specifically, when system 100 powers up, a P-channel metal-oxide semiconductor field-effect transistor (PFET) ring oscillator 102 along with a N-channel metal-oxide semiconductor field-effect transistor (NFET) ring oscillator 104 can begin operating or running. It is appreciated that PFET ring oscillator 102 can be utilized within system 100 to determine the PFET process corner of its fabricated circuitry. Conversely, the NFET ring oscillator 104 can be utilized within system 100 to determine the NFET process corner of its fabricated circuitry. Note that PFET ring oscillator 102 can be referred to as a diagnostic PFET ring oscillator 102. Moreover, NFET ring oscillator 104 can be referred to as a diagnostic NFET ring oscillator 104.

Within FIG. 1, a counter and latch module 106 can be coupled to the PFET ring oscillator 102 in order to measure its oscillation frequency during a defined amount of time (or time frame). Once its oscillation frequency has been counted and latched by module 106, a software control module 110 that is part of pull-up structure 112 of output driver (or stage) 164 can be coupled to receive (or retrieve) that counted value. The software control module 110 can be operating on a processor 111. Note that software control module 110 can query the counter and latch module 106 for the oscillation frequency value or count. Upon receipt of the oscillation frequency value of the PFET ring oscillator 102, software control module 110 can compare it to one or more values (e.g., of a lookup table) to determine whether the PFET process corner is, but not limited to, fast, slow, or typical. Note that the process corner values can be experimentally predetermined. Once the PFET process corner is determined, the software control module 110 can then convert the determined PFET process corner to a particular number of "legs" to be activated of pull-up stage 112. Then the software control module 110 can output a digital signal 132 to "legs" 116, 118, 120, 122, and 124 via a digital bus 133 as part of the process of activating the particular number of "legs". In this manner, software control module 110 participates in activating the appropriate number of legs 116-124 in order to tune (or modify) the impedance of output driver 164.

For example, if the software control module 110 determines that the PFET ring oscillator 102 is a fast PFET process corner, it may cause one of "legs" 116-124 to be activated while maintaining the other legs inactive by outputting a particular digital signal 132 via bus 133. For instance, if software control module 110 wants to activate leg 116 while maintaining legs 118-124 inactive, the software control module 110 can output a digital signal 132 that includes a low voltage value (e.g., logic "0") for a logic OR gate 130 of leg 116 along with a high voltage value (e.g., logic "1") for each of the logic OR gates of legs 118-124. Note that when an inverter circuit 114 receives a high voltage (e.g., logic "1") from input 162, the inverter 114 can output a low voltage (e.g., logic "0") that is received by each logic OR gate (e.g., 130) of legs 116-124. Since both of the inputs of OR gate 130 of leg 116 are low voltage (e.g., logic "0"), the OR gate 130 outputs a low voltage (e.g., logic "0") which activates its associated transistor 128 since its source is coupled with a voltage source ($V_{pwr}$ or $V_{DD}$) 126 having a high voltage value (e.g., logic "1"). However, since each OR gate of legs 118-124 has an input at a low voltage (e.g., logic "0") and the other input at a high voltage (e.g., logic "1"), each OR gate of legs 118-124 outputs a high voltage (e.g., logic "1"). As such, each transistor of legs 118-124 remains inactive since its gate is at a high voltage (e.g., logic "1") and its source is at a high voltage of $V_{pwr}$ 126.

Alternatively, if the software control module 110 determines that the PFET ring oscillator 102 is a slow PFET process corner, it may cause all of legs 116-124 to be activated by outputting a particular digital signal 132 via bus 133. For instance, if software control module 110 wants to activate legs 116-124, the software control module 110 can output a digital signal 132 that includes a low voltage value for each of the logic OR gates (e.g., 130) of legs 116-124. When inverter 114 receives a high voltage (e.g., logic "1") from input 162, the inverter 114 can output a low voltage (e.g., logic "0") that is received by each logic OR gate (e.g., 130) of legs 116-124. Since both of the inputs of each OR gate (e.g., 130) of legs 116-124 are at a low voltage (e.g., logic "0"), each OR gate outputs a low voltage (e.g., logic "0") which activates its associated transistor (e.g., 128) since the transistor's source is coupled with voltage source 126.

Furthermore, if the software control module 110 determines that the PFET ring oscillator 102 is a typical PFET process corner, it may cause three of legs 116-124 to be activated by outputting a particular digital signal 132 via bus 133. For instance, if software control module 110 wants to activate three of legs 116-124 while maintaining two of them inactive, the software control module 110 can output a digital signal 132 that includes a low voltage value (e.g., logic "0") for each of the logic OR gates (e.g., 130) of legs 116, 118, and 120 along with a high voltage value (e.g., logic "1") for each of the logic OR gates of legs 122 and 124. Note that when inverter circuit 114 receives a high voltage (e.g., logic "1") from input 162, the inverter 114 can output a low voltage (e.g., logic "0") that is received by each logic OR gate (e.g., 130) of legs 116-124. Since both of the inputs of the OR gates (e.g., 130) of legs 116, 118, and 120 are at a low voltage (e.g., logic "0"), each of these OR gates outputs a low voltage (e.g., logic "0") which activates its associated transistor (e.g., 128) of legs 116, 118, and 120 since its source is coupled with $V_{pwr}$ 126. However, since each OR gate of legs 122 and 124 has an input at a low voltage (e.g., logic "0") and the other input at a high voltage (e.g., logic "1"), each OR gate of legs 122 and 124 outputs a high voltage (e.g., logic "1"). As such, each transistor of legs 122 and 124 remains inactive since its gate is at a high voltage (e.g., logic "1") and its source is at $V_{pwr}$ 126. Therefore, software control module 110 can select the appropriate number of legs 116-124 to activate in order to tune (or modify) the impedance of output driver 164.

Within FIG. 1, a counter and latch module 108 can be coupled to the NFET ring oscillator 104 to measure its oscillation frequency during a defined amount of time (or time frame). Once its oscillation frequency has been counted and latched by module 108, a software control module 136 that is part of pull-down structure 134 of output driver (or stage) 164 can be coupled to receive (or retrieve) that counted value. The software control module 136 can be operating on a processor 140. Note that software control module 136 can query the counter and latch module 108 for the oscillation frequency value or count. Upon receipt of the oscillation frequency value of the NFET ring oscillator 104, the software control module 136 can compare it to one or more values (e.g., of a lookup table) to determine whether the NFET process corner is, but not limited to, fast, slow, or typical. Note that the process corner values can be experimentally predetermined. Once the NFET process corner is determined, the software control module 136 can then convert the determined NFET process corner to a particular number of "legs" to be activated of pull-down stage 134. Then the software control module 136 can output a digital signal 142 to "legs" 150, 152, 154, 156, and 158 via a digital bus 143 as part of the process of activating the particular number of "legs". In this manner, software control module 136 participates in activating the appropriate number of legs 150-158 in order to tune (or modify) the impedance of output driver 164.

For example, if the software control module 136 determines that the NFET ring oscillator 104 is a fast NFET process corner, it may cause one of "legs" 150-158 to be activated while maintaining the other legs inactive by outputting a particular digital signal 142 via bus 143. For instance, if software control module 136 wants to activate leg 150 while maintaining legs 152-158 inactive, the software control module 136 can output a digital signal 142 that includes a high voltage value (e.g., logic "1") for a logic AND gate 144 of leg 150 along with a low voltage value (e.g., logic "0") for each of the logic AND gates of legs 152-158. Note that when an inverter circuit 138 receives a low voltage (e.g., logic "0") from input 162, the inverter 138 can output a high voltage (e.g., logic "1") that is received by each logic AND gate (e.g., 144) of legs 150-158. Since both of the inputs of AND gate 144 of leg 150 are high voltage (e.g., logic "1"), the AND gate 144 outputs a high voltage (e.g., logic "1") which activates its associated transistor 146 since its source is coupled with a voltage ground ($V_{gnd}$) 148 having a low voltage value (e.g., logic "0"). However, since each AND gate of legs 152-158 has an input at a low voltage (e.g., logic "0") and the other input at a high voltage (e.g., logic "1"), each AND gate of legs 152-158 outputs a low voltage (e.g., logic "0"). As such, each transistor of legs 152-158 remains inactive since its gate is at a low voltage (e.g., logic "0") and its source is at a low voltage of $V_{gnd}$ 148.

Alternatively, if the software control module 136 determines that the NFET ring oscillator 104 is a slow NFET process corner, it may cause all of legs 150-158 to be activated by outputting a particular digital signal 142 via bus 143. For instance, if software control module 136 wants to activate legs 150-158, the software control module 136 can output a digital signal 142 that includes a high voltage value (e.g., logic "1") for each of the logic AND gates (e.g., 144) of legs 150-158. When inverter 138 receives a low voltage (e.g., logic "0") from input 162, the inverter 138 can output a high voltage (e.g., logic "1") that is received by each logic AND gate (e.g., 144) of legs 150-158. Since both of the inputs of each AND gate (e.g., 144) of legs 150-158 are at a high voltage (e.g., logic "1"), each AND gate outputs a high voltage (e.g., logic "1") which activates its associated transistor (e.g., 146) since the transistor's source is coupled with $V_{gnd}$ 148.

Furthermore, if the software control module 136 determines that the NFET ring oscillator 104 is a typical NFET process corner, it may cause three of "legs" 150-158 to be activated while maintaining the other two legs inactive by outputting a particular digital signal 142 via bus 143. For instance, if software control module 136 wants to activate three of legs 150-158 while maintaining two of them inactive, the software control module 136 can output a digital signal 142 that includes a high voltage value (e.g., logic "1") for each of the logic AND gates (e.g., 144) of legs 150, 152, and 154 along with a low voltage value (e.g., logic "0") for each of the logic AND gates of legs 156 and 158. Note that when inverter circuit 138 receives a low voltage (e.g., logic "0") from input 162, the inverter 138 can output a high voltage (e.g., logic "1") that is received by each logic AND gate (e.g., 144) of legs 150-158. Since both of the inputs of each AND gate (e.g., 144) of legs 150, 152, and 154 are high voltage (e.g., logic "1"), each of these AND gates outputs a high voltage (e.g., logic "1") which activates its associated transistor (e.g., 146) of legs 150, 152, and 154 since its source is coupled with $V_{gnd}$ 148. However, since each AND gate of legs 156 and 158 has an input at a low voltage (e.g., logic "0") and the other input at a high voltage (e.g., logic "1"), each AND gate of legs 156 and 158 outputs a low voltage (e.g., logic "0"). As such, each transistor of legs 156 and 158 remains inactive since its gate is at a low voltage (e.g., logic "0") and its source is at a low voltage of $V_{gnd}$ 148. Therefore, software control module 136 can select the appropriate number of legs 150-158 to activate in order to tune (or modify) the impedance of output driver 164.

In this manner, the impedance of an output 160 of output driver 164 can be controlled or tuned in order to compensate for the determined PFET process corner along with the determined NFET process corner of the fabricated circuitry of system 100 that includes PFET ring oscillator 102 and NFET ring oscillator 104. Therefore, the process sensitivity can be reduced or eliminated. Note that this calibration of the impedance can be done at the boot up of system 100. Moreover, the calibration of the impedance can be performed periodically or continuously, but is not limited to such.

Within FIG. 1, one of the advantages of system 100 is that it can operate for higher performance interfaces. Another advantage of system 100 is that it does not involve off-chip components and no feedback based calibration loop is needed. Yet another advantage of system 100 is that it does not involve an additional processing operation such as fuse blowing. Still another advantage of system 100 is that it can be implemented with a simpler topology and result in possibly smaller area and lower power.

The PFET ring oscillator 102 is coupled with the counter and latch module 106, which is coupled with software control module 110. The software control module 110 is coupled with processor 111 and also coupled with legs 116, 118, 120, 122, and 124 via bus 133. Specifically, software control module 110 is coupled with a first input terminal of OR gate 130 of leg 116. A second input terminal of the OR gate 130 of leg 116 is coupled with inverter 114. An output terminal of the OR gate 130 of leg 116 is coupled with the gate of transistor 128. The source of transistor 128 is coupled with $V_{pwr}$ 126. The drain of transistor 128 is coupled with output 160 and coupled with the drain of each transistor of legs 118, 120, 122, and 124. Input 162 is coupled with inverters 114 and 138. It is appreciated that the OR gate and transistor of each of legs 118, 120, 122, and 124 can be coupled in a manner similar to that of leg 116. The digital bus 133 has been implemented as a five bit bus, but can be implemented with a greater or less number of bits.

Within FIG. 1, the NFET ring oscillator 104 is coupled with the counter and latch module 108, which is coupled with software control module 136. The software control module 136 is coupled with processor 140 and also coupled with legs 150, 152, 154, 156, and 158 via bus 143. Specifically, software control module 136 is coupled with a first input terminal of AND gate 144 of leg 150. A second input terminal of AND gate 144 of leg 150 is coupled with inverter 138. An output terminal of the AND gate 144 is coupled with the gate of transistor 146. The source of transistor 146 is coupled with $V_{gnd}$ 148. The drain of transistor 146 is coupled with output 160 and coupled with the drain of each transistor of legs 152, 154, 156, and 158. It is appreciated that the AND gate and transistor of each of legs 152, 154, 156, and 158 can be coupled in a manner similar to that of leg 150. The digital bus 143 has been implemented as a five bit bus, but can be implemented with a greater or less number of bits.

Note that each of transistors (e.g., 128 and 146) of legs 116-124 and 150-158 can be implemented in a wide variety of ways in accordance with embodiments of the invention. For example, each of transistors (e.g., 128 and 146) of legs 116-124 and 150-158 can be implemented as, but is not limited to, a P-channel MOSFET (metal-oxide semiconductor field-effect transistor) which is also known as a PMOS or PFET. Furthermore, each of transistors (e.g., 128 and 146) of legs 116-124 and 150-158 can be implemented as, but is not limited to, a N-channel MOSFET which is also known as a NMOS or NFET. It is appreciated that each of transistors (e.g., 128 and 146) of legs 116-124 and 150-158 can be implemented as, but is not limited to, a PMOS, a NMOS, or any other type of transistor. It is noted that each of transistors (e.g., 128 and 146) of legs 116-124 and 150-158 can be referred to as a switching element. Note that a gate, a drain, and a source of a transistor can each be referred to as a terminal of its transistor. Additionally, the gate of a transistor can also be referred to as a control terminal of its transistor.

Within FIG. 1, it is appreciated that software control modules 110 and 136 can each receive information regarding how to convert an oscillation frequency count into a particular process corner. That information can be provided in a wide variety of ways. For example, the information can be provided by memory (not shown), e.g., read only memory (ROM), non-volatile memory, and/or volatile memory, or from one or more fuses, but is not limited to such. Additionally, the information can also come from one or more lookup tables (not shown). It is understood that software control modules 110 and 136 can each be read in from off-chip memory at the power up of system 100, but is not limited to such. Furthermore, the functionality enabling software control modules 110 and 136 to convert a process corner into the number of legs to activate can be read in from memory (not shown).

It is appreciated that system 100 may not include all of the elements illustrated by FIG. 1. Furthermore, system 100 can be implemented to include other elements not shown by FIG. 1. Moreover, each of pull-up stage 112 and pull-down stage 134 may not include all of the elements illustrated by FIG. 1. Additionally, each of pull-up stage 112 and pull-down stage 134 can be implemented to include other elements not shown by FIG. 1.

Figure 2:
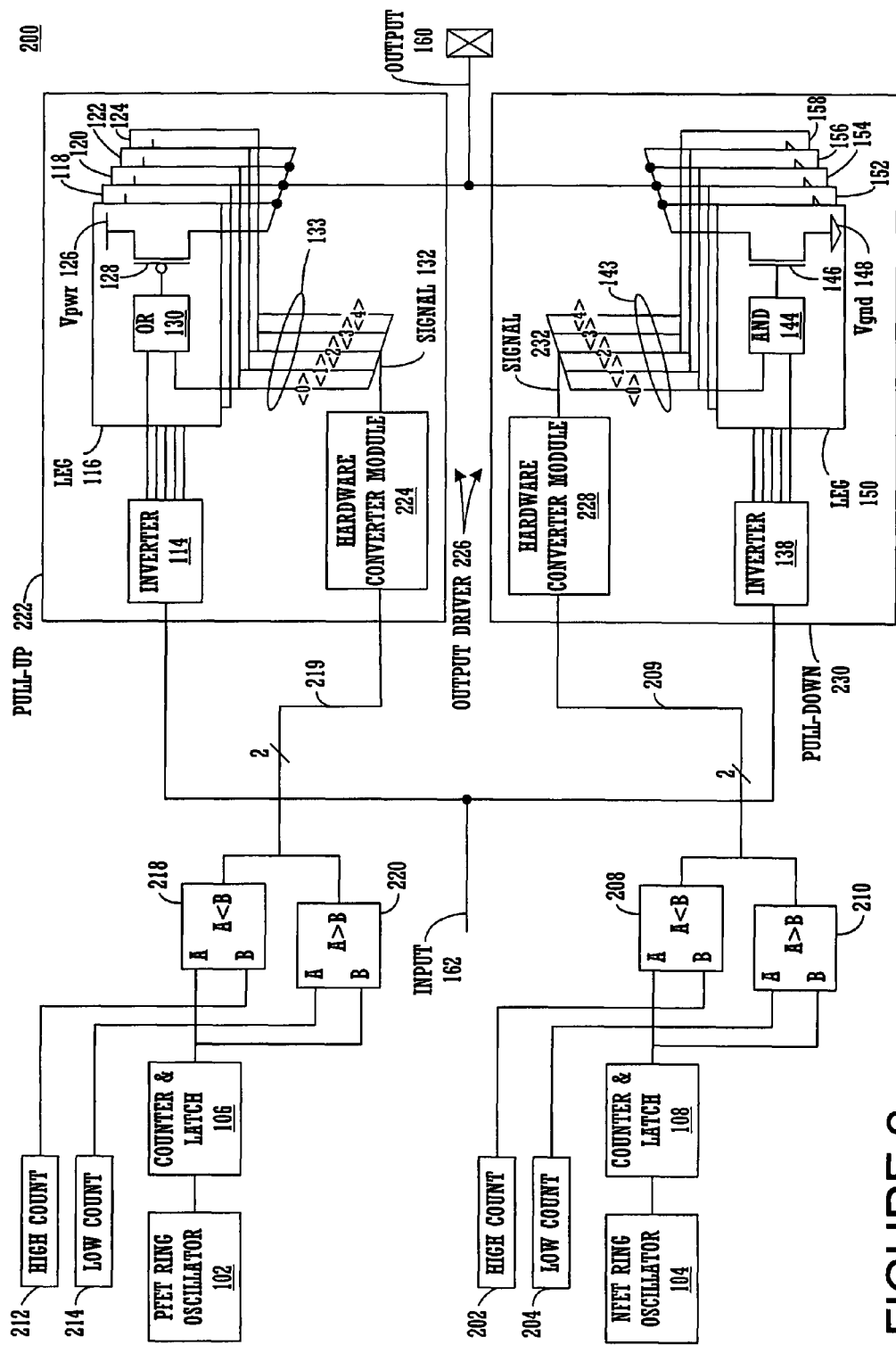
FIG. 2 is a block diagram of another exemplary system for controlling impedance of an output driver in accordance with embodiments of the invention.

FIG. 2 is a block diagram of an exemplary system 200 for controlling or tuning impedance of an output driver 226 in accordance with embodiments of the invention. Within system 200, the oscillation frequencies of a NFET based ring oscillator (e.g., 104) and a PFET based ring oscillator (e.g., 102) can be sampled periodically and compared against limits that can either be loaded into registers or hard coded into the silicon, but are not limited to such. Based on the results of these comparisons, it can then be determined whether the process corner of the fabricated circuitry of system 200 is, for example, fast, typical, or slow. Based on the determined process corner, the output impedance of output 160 can then be tuned or modified and the process sensitivity can be reduced or eliminated. The output driver (or stage) 226 has been implemented to include a five "leg" pull-up structure 222 along with a five "leg" pull-down structure 230. However, pull-up structure 222 and pull-down structure 230 can each be implemented with any number of "legs" greater or less than that shown within system 200. It is understood that as each leg is activated within the pull-up structure 222 and/or pull-down structure 230, the inherent impedance of each leg is added to the impedance of the output driver 226. It is appreciated that components of system 200 with the same reference number as system 100 (FIG. 1) can operate in a manner similar to that described herein.

Specifically, when system 200 powers up, PFET ring oscillator 102 along with NFET ring oscillator 104 can begin operating or running. It is understood that PFET ring oscillator 102 can be utilized within system 200 to determine the PFET process corner of its fabricated circuitry. Conversely, lhe NFET ring oscillator 104 can be utilized within system 200 to determine the NFET process corner of its fabricated circuitry. Note that PFET ring oscillator 102 can be referred to as a diagnostic PFET ring oscillator 102. Moreover, NFET ring oscillator 104 can be referred to as a diagnostic NFET ring oscillator 104.

Within FIG. 2, a counter and latch module 106 can be coupled to the PFET ring oscillator 102 in order to measure its oscillation frequency during a defined or fixed amount of time (or time frame). Once its oscillation frequency has been counted and latched by module 106, comparators 218 and 220 together with a high count threshold value 212 and a low count threshold value 214 can be utilized to convert the count to an indication of the determined PFET process corner. Specifically, once its oscillation frequency has been counted and latched by module 106, comparators 218 and 220 are each coupled to receive the determined oscillation frequency value. Additionally, input "A" of comparator 218 and input "B" of comparator 220 are coupled to the output of module 106. The high count limit 212 can be coupled to input "B" of comparator 218 while the low count limit 214 can be coupled to input "A" of comparator 220. The high-count limit 212 and low count limit 214 can be stored by one or more registers, but are limited to such. Furthermore, the values of high count limit 212 and low count limit 214 can be loaded by software into the one or more registers, or they can each be hard coded values, but are not limited to such. Note that the high-count limit 212 and low count limit 214 can be experimentally predetermined.

It is appreciated that comparators 218 and 220 can output via bus 219 a two bit signal indicating that the PFET process corner is, but not limited to, fast, typical, or slow. For example, if comparator 218 determines that the output frequency oscillation value is not less than the high count limit 214 and comparator 220 determines that the oscillation value is not less than the low count limit 212, comparators 218 and 220 can each output via bus 219 a low voltage signal (e.g., logic "0") that together can indicate a fast PFET process corner. However, if comparator 218 determines that the output frequency oscillation value is less than the high count limit 214 and comparator 220 determines that the oscillation value is not less than the low count limit 212, comparator 218 can output via bus 219 a high voltage (e.g., logic "1") and comparator 220 can output via bus 219 a low voltage signal (e.g., logic "0") that together can indicate a typical PFET process corner. Furthermore, if comparator 218 determines that the output frequency oscillation value is less than the high-count limit 214 and comparator 220 determines that oscillation value is less than the low count limit 212, comparators 218 and 220 can each output via bus 219 a high voltage (e.g., logic "1") that together can indicate a slow PFET process corner. In this manner, comparators 218 and 220 can indicate to a hardware converter module 224 of pull-up structure 222 of output driver (or stage) 226 whether the PFET process corner is fast, typical, or slow. Note that the output signals of comparators 218 and 220 described above are exemplary.

Within FIG. 2, upon reception of an indication of the PFET process corner from comparators 218 and 220 via bus 219, the hardware converter module 224 can convert the indicated or determined PFET process corner to a particular number of "legs" to be activated of pull-up stage 222. Then the hardware converter module 224 can output a digital signal 225 to "legs" 116, 118, 120, 122, and 124 via digital bus 133 as part of the process of activating the particular number of "legs". In this manner, hardware converter module 224 participates in activating the appropriate number of legs 116-124 in order to tune (or modify) the impedance of output driver 226.

For example, if the hardware converter module 224 determines that the PFET ring oscillator 102 is a fast PFET process corner, it may cause one of "legs" 116-124 to be activated while maintaining the other legs inactive by outputting a particular digital signal 225 via bus 133. For instance, if hardware converter module 224 wants to activate leg 116 while maintaining legs 118-124 inactive, the hardware converter module 224 can output a digital signal 225 that includes a low voltage value (e.g., logic "0") for the logic OR gate 130 of leg 116 along with a high voltage value (e.g., logic "1") for each of the logic OR gates of legs 118-124. Note that when inverter circuit 114 receives a high voltage (e.g., logic "1") from input 162, the inverter 114 can output a low voltage (e.g., logic "0") that is received by each logic OR gate (e.g., 130) of legs 116-124. Since both of the inputs of OR gate 130 of leg 116 are low voltage (e.g., logic "0"), the OR gate 130 outputs a low voltage (e.g., logic "0") which activates its associated transistor 128 since its source is coupled with $V_{pwr}$ 126 having a high voltage value (e.g., logic "1"). However, since each OR gate of legs 118-124 has an input at a low voltage (e.g., logic "0") and the other input at a high voltage (e.g., logic "1"), each OR gate of legs 118-124 outputs a high voltage (e.g., logic "1"). As such, each transistor of legs 118-124 remains inactive since its gate is at a high voltage (e.g., logic "1") and its source is at $V_{pwr}$ 126.

Alternatively, if the hardware converter module 224 determines that the PFET ring oscillator 102 is a slow PFET process corner, it may cause all of legs 116-124 to be activated by outputting a particular digital signal 225 via bus 133. For instance, if hardware converter module 224 wants to activate legs 116-124, the hardware converter module 224 can output a digital signal 225 that includes a low voltage value for each of the logic OR gates (e.g., 130) of legs 116-124. When inverter 114 receives a high voltage (e.g., logic "1") from input 162, the inverter 114 can output a low voltage (e.g., logic "0") that is received by each logic OR gate (e.g., 130) of legs 116-124. Since both of the inputs of each OR gate (e.g., 130) of legs 116-124 are at a low voltage (e.g., logic "0"), each OR gate outputs a low voltage (e.g., logic "0") which activates its associated transistor (e.g., 128) since the transistor's source is coupled with voltage source 126.

Furthermore, if the hardware converter module 224 determines that the PFET ring oscillator 102 is a typical PFET process corner, it may cause three of legs 116-124 to be activated by outputting a particular digital signal 225 via bus 133. For instance, if hardware converter module 224 wants to activate three of legs 116-124 while maintaining two of them inactive, the hardware converter module 224 can output a digital signal 225 that includes a low voltage value (e.g., logic "0") for each of the logic OR gates (e.g., 130) of legs 116, 118, and 120 along with a high voltage value (e.g., logic "1") for each of the logic OR gates of legs 122 and 124. Note that when inverter circuit 114 receives a high voltage (e.g., logic "1") from input 162, the inverter 114 can output a low voltage (e.g., logic "0") that is received by each logic OR gate (e.g., 130) of legs 116-124. Since both of the inputs of each OR gate (e.g., 130) of legs 116, 118, and 120 are at a low voltage (e.g., logic "0"), each of these OR gates outputs a low voltage (e.g., logic "0") which activates its associated transistor (e.g., 128) of legs 116, 118, and 120 since its source is coupled with $V_{pwr}$ 126. However, since each OR gate of legs 122 and 124 has an input at a low voltage (e.g., logic "0") and the other input at a high voltage (e.g., logic "1"), each OR gate of legs 122 and 124 outputs a high voltage (e.g., logic "1"). As such, each transistor of legs 122 and 124 remains inactive since its gate is at a high voltage (e.g., logic "1") and its source is at $V_{pwr}$ 126. Therefore, hardware converter module 224 can select the appropriate number of legs 116-124 to activate in order to tune (or modify) the impedance of output driver 226.

Within FIG. 2, a counter and latch module 108 can be coupled to the NFET ring oscillator 104 to measure its oscillation frequency during a defined or fixed amount of time (or time frame). Once its oscillation frequency has been counted and latched by module 108, comparators 208 and 210 together with a high count threshold value 202 and a low count threshold value 204 can be utilized to convert the count to an indication of the determined NFET process corner. Specifically, once its oscillation frequency has been counted and latched by module 108, comparators 208 and 210 are each coupled to receive the determined oscillation frequency value. Additionally, input "A" of comparator 208 and input "B" of comparator 210 are coupled to the output of module 108. The high count threshold limit 202 can be coupled to input "B" of comparator 208 while the low count threshold limit 204 can be coupled to input "A" of comparator 210. The high-count limit 202 and low count limit 204 can be stored by one or more registers, but are limited to such. Furthermore, the values of high count limit 202 and low count limit 204 can be loaded by software into the one or more registers, or they can each be hard coded values, but are not limited to such. Note that the high-count limit 202 and low count limit 204 can be experimentally predetermined.

It is appreciated that comparators 208 and 210 can output via bus 209 a two bit signal indicating that the NFET process corner is, but not limited to, fast, typical, or slow. For example, if comparator 208 determines that the output frequency oscillation value is not less than the high count limit 202 and comparator 210 determines that oscillation value is not less than the low count limit 204, comparators 208 and 210 can each output via bus 209 a low voltage signal (e.g., logic "0") that together can indicate a fast NFET process corner. However, if comparator 208 determines that the frequency oscillation value is less than the high count limit 202 and comparator 210 determines that oscillation value is not less than the low count limit 204, comparator 208 can output via bus 209 a high voltage (e.g., logic "1") and comparator 210 can output via bus 209 a low voltage signal (e.g., logic "0") that together can indicate a typical NFET process corner. Furthermore, if comparator 208 determines that the frequency oscillation value is less than the high-count limit 202 and comparator 210 determines that oscillation value is less than the low count limit 204, comparators 208 and 210 can each output via bus 209 a high voltage (e.g., logic "1") that together can indicate a slow NFET process corner. In this manner, comparators 208 and 210 can indicate to a hardware converter module 228 of pull-up structure 230 of output driver (or stage) 226 whether the NFET process corner is fast, typical, or slow. Note that the output signals of comparators 208 and 210 described above are exemplary.

Within FIG. 2, upon reception of an indication of the NFET process corner from comparators 208 and 210 via bus 209, the hardware converter module 228 can convert the indicated or determined NFET process corner to a particular number of "legs" to be activated of pull-down stage 230. Then the hardware converter module 228 can output a digital signal 142 to "legs" 150, 152, 154, 156, and 158 via digital bus 143 as part of the process of activating the particular number of "legs". In this manner, hardware converter module 228 participates in activating the appropriate number of legs 150-158 in order to tune (or modify) the impedance of output driver 226.

For example, if the hardware converter module 228 determines that the NFET ring oscillator 104 is a fast NFET process corner, it may cause one of "legs" 150-158 to be activated while maintaining the other legs inactive by outputting a particular digital signal 232 via bus 143. For instance, if hardware converter module 228 wants to activate leg 150 while maintaining legs 152-158 inactive, the hardware converter module 228 can output a digital signal 232 that includes a high voltage value (e.g., logic "1") for a logic AND gate 144 of leg 150 along with a low voltage value (e.g., logic "0") for each of the logic AND gates of legs 152-158. Note that when inverter circuit 138 receives a low voltage (e.g., logic "0") from input 162, the inverter 138 can output a high voltage (e.g., logic "1") that is received by each logic AND gate (e.g., 144) of legs 150-158. Since both of the inputs of AND gate 144 of leg 150 are high voltage (e.g., logic "1"), the AND gate 144 outputs a high voltage (e.g., logic "1") which activates its associated transistor 146 since its source is coupled with a voltage ground ($V_{gnd}$) 148 having a low voltage value (e.g., logic "0"). However, since each AND gate of legs 152-158 has an input at a low voltage (e.g., logic "0") and the other input at a high voltage (e.g., logic "1"), each AND gate of legs 152-158 outputs a low voltage (e.g., logic "0"). As such, each transistor of legs 152-158 remains inactive since its gate is at a low voltage (e.g., logic "0") and its source is at a low voltage of $V_{gnd}$ 148.

Alternatively, if the hardware converter module 228 determines that the NFET ring oscillator 104 is a slow NFET process corner, it may cause all of legs 150-158 to be activated by outputting a particular digital signal 232 via bus 143. For instance, if hardware converter module 228 wants to activate legs 150-158, the hardware converter module 228 can output a digital signal 232 that includes a high voltage value (e.g., logic "0") for each of the logic AND gates (e.g., 144) of legs 150-158. When inverter 138 receives a low voltage (e.g., logic "0") from input 162, the inverter 138 can output a high voltage (e.g., logic "1") that is received by each logic AND gate (e.g., 144) of legs 150-158. Since both of the inputs of each AND gate (e.g., 144) of legs 150-158 are at a high voltage (e.g., logic "1"), each AND gate outputs a high voltage (e.g., logic "1") which activates its associated transistor (e.g., 146) since the transistor's source is coupled with $V_{gnd}$ 148.

Furthermore, if the hardware converter module 228 determines that the NFET ring oscillator 104 is a typical NFET process corner, it may cause three of "legs" 150-158 to be activated while maintaining the other two legs inactive by outputting a particular digital signal 232 via bus 143. For instance, if hardware converter module 228 is going to activate three of legs 150-158 while maintaining two of them inactive, the hardware converter module 228 can output a digital signal 232 that includes a high voltage value (e.g., logic "1") for each of the logic AND gates (e.g., 144) of legs 150, 152, and 154 along with a low voltage value (e.g., logic "0") for each of the logic AND gates of legs 156 and 158. Note that when inverter 138 receives a low voltage (e.g., logic "0") from input 162, the inverter 138 can output a high voltage (e.g., logic "1") that is received by each logic AND gate (e.g., 144) of legs 150-158. Since both of the inputs of each AND gate (e.g., 144) of legs 150, 152, and 154 are high voltage (e.g., logic "1"), each of these AND gates outputs a high voltage (e.g., logic "1") which activates its associated transistor (e.g., 146) of legs 150, 152, and 154 since its source is coupled with $V_{gnd}$ 148. However, since each AND gate of legs 156 and 158 has an input at a low voltage (e.g., logic "0") and the other input at a high voltage (e.g., logic "1"), each AND gate of legs 156 and 158 outputs a low voltage (e.g., logic "0"). As such, each transistor of legs 156 and 158 remains inactive since its gate is at a low voltage (e.g., logic "0") and its source is at a low voltage of $V_{gnd}$ 148. Therefore, hardware converter module 228 can select the appropriate number of legs 150-158 to activate in order to tune (or modify) the impedance of output driver 226.

In this manner, within FIG. 2, the impedance of output 160 of output driver 226 can be controlled or tuned in order to compensate for the determined PFET process corner along with the determined NFET process corner of the fabricated circuitry of system 200 that includes PFET ring oscillator 102 and NFET ring oscillator 104. As such, the process sensitivity can be reduced or eliminated. Note that this calibration of the impedance can be done at the boot-up or start-up of system 200. Moreover, the calibration of the impedance can be performed periodically or continuously, but is not limited to such.

Within FIG. 2, one of the advantages of system 200 is that it can operate for higher performance interfaces. Another advantage of system 200 is that it does not involve off-chip components and no feedback based calibration loop is needed. Yet another advantage of system 200 is that it does not involve an additional processing operation such as fuse blowing. Still another advantage of system 200 is that it can be implemented with a simpler topology and result in possibly smaller area and lower power.

The PFET ring oscillator 102 is coupled with the counter and latch module 106, which is coupled with input "A" of comparator 218 and input "B" of comparator 220. The high-count value 212 is coupled with input "B" of comparator 218 and the low count value 214 is coupled with input "A" of comparator 220. The outputs of comparators 218 and 220 are coupled with hardware converter module 224 via bus 219. The hardware converter module 224 is coupled with legs 116, 118, 120, 122, and 124 via bus 133. Specifically, hardware converter module 224 is coupled with a first input terminal of OR gate 130 of leg 116. A second input terminal of the OR gate 130 of leg 116 is coupled with inverter 114. An output terminal of the OR gate 130 of leg 116 is coupled with the gate of transistor 128. The source of transistor 128 is coupled with $V_{pwr}$ 126. The drain of transistor 128 is coupled with output 160 and coupled with the drain of each transistor of legs 118, 120, 122, and 124. Input 162 is coupled with inverters 114 and 138. It is understood that the OR gate and transistor of each of legs 118, 120, 122, and 124 can be coupled in a manner similar to that of leg 116. The digital bus 133 has been implemented as a five bit bus, but can be implemented with a greater or less number of bits.

Within FIG. 2, the NFET ring oscillator 104 is coupled with the counter and latch module 108, which is coupled with input "A" of comparator 208 and input "B" of comparator 210. The high-count value 202 is coupled with input "B" of comparator 208 and the low count value 204 is coupled with input "A" of comparator 210. The outputs of comparators 208 and 210 are coupled with hardware converter module 228 via bus 209. The hardware converter module 228 is coupled with legs 150, 152, 154, 156, and 158 via bus 143. Specifically, hardware converter module 228 is coupled with a first input terminal of AND gate 144 of leg 150. A second input terminal of AND gate 144 is coupled with inverter 138. An output terminal of the AND gate 144 is coupled with the gate of transistor 146. The source of transistor 146 is coupled with $V_{gnd}$ 148. The drain of transistor 146 is coupled with output 160 and coupled with the drain of each transistor of legs 152, 154, 156, and 158. It is understood that the AND gate and transistor of each of legs 152, 154, 156, and 158 can be coupled in a manner similar to that of leg 150. The digital bus 143 has been implemented as a five bit bus, but can be implemented with a greater or less number of bits.

Note that each of transistors (e.g., 128 and 146) of legs 116-124 and 150-158 can be implemented in a wide variety of ways in accordance with embodiments of the invention. For example, each of transistors (e.g., 128 and 146) of legs 116-124 and 150-158 can be implemented as, but is not limited to, a P-channel MOSFET which is also known as a PMOS or PFET. Furthermore, each of transistors (e.g., 128 and 146) of legs 116-124 and 150-158 can be implemented as, but is not limited to, a N-channel MOSFET which is also known as a NMOS or NFET. It is appreciated that each of transistors (e.g., 128 and 146) of legs 116-124 and 150-158 can be implemented as, but is not limited to, a PMOS, a NMOS, or any other type of transistor. It is noted that each of transistors (e.g., 128 and 146) of legs 116-124 and 150-158 can be referred to as a switching element. Note that a gate, a drain, and a source of a transistor can each be referred to as a terminal of its transistor. Additionally, the gate of a transistor can also be referred to as a control terminal of its transistor.

Within FIG. 2, it is understood that the hardware converter modules 224 and 228 can each be implemented with hardware in a wide variety of ways. For example, hardware converter modules 224 and 228 can each be implemented with computational logic. In another embodiment, hardware converter modules 224 and 228 can each be implemented with one or more hardware state machines.

It is appreciated that system 200 may not include all of the elements illustrated by FIG. 2. Furthermore, system 200 can be implemented to include other elements not shown by FIG. 2. Moreover, each of pull-up stage 222 and pull-down stage 230 may not include all of the elements illustrated by FIG. 2. Additionally, each of pull-up stage 222 and pull-down stage 230 can be implemented to include other elements not shown by FIG. 2.

Figure 3A:
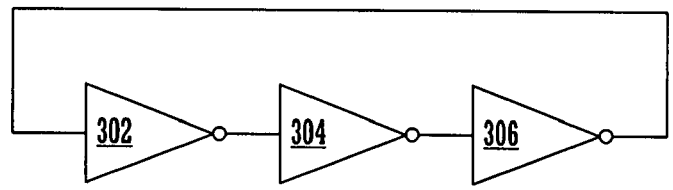
FIG. 3A is a schematic of an exemplary PFET ring oscillator circuit in accordance with embodiments of the invention.

FIG. 3A is a schematic of an exemplary PFET ring oscillator circuit 300 in accordance with embodiments of the invention. It is appreciated that PFET ring oscillator circuit 300 can be utilized as an implementation for PFET ring oscillator 102 of FIGS. 1 and 2. The PFET ring oscillator circuit 300 includes PFET logic inverter circuits 302, 304, and 306 that are coupled in series. Specifically, an output terminal of inverter circuit 302 is coupled with an input terminal of inverter circuit 304. Additionally, an output terminal of inverter circuit 304 is coupled with an input terminal of inverter circuit 306. An output terminal of inverter circuit 306 is fed back and coupled with an input terminal of inverter circuit 302. Note that PFET ring oscillator circuit 300 can be implemented in a wide variety of ways. For example, the PFET ring oscillator circuit 300 can be implemented with a greater number of logic inverter circuits than that shown in FIG. 3A.

Figure 3B:
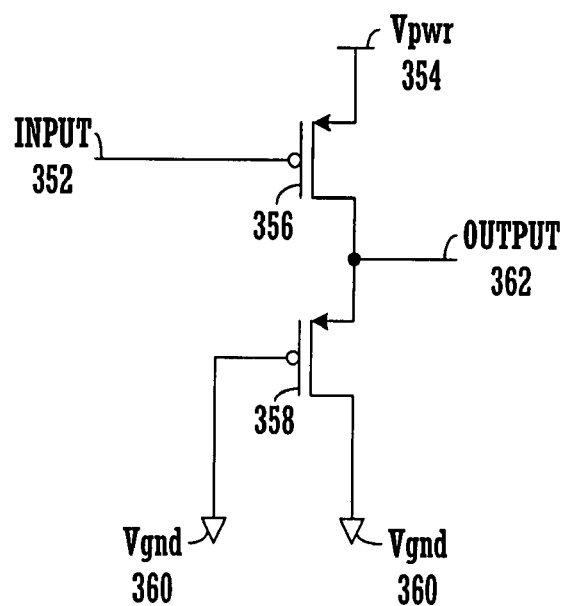
FIG. 3B is a schematic of an exemplary PFET inverter circuit in accordance with embodiments of the invention.

FIG. 3B is a schematic of an exemplary PFET logic inverter circuit 350 in accordance with embodiments of the invention. It is appreciated that PFET logic inverter circuit 350 can be utilized as an implementation for each of PFET logic inverter circuits 302, 304, and 306 of FIG. 3A. It is appreciated that transistor 358 is on or active. As such, when a high voltage (e.g., logic "1") is driven into input 352, transistor 356 is turned off. As such, $V_{gnd}$ 360 pulls output 362 to ground or a low voltage (e.g., logic "0"). Conversely, when a low voltage (e.g., logic "0") is driven into input 352, transistor 356 is turned on (or activated) and $V_{gwr}$ 354 pulls output 362 to the voltage source or a high voltage (e.g., logic "1") even though the activated transistor 358 is trying to pull output 362 towards ground or a low voltage (e.g., logic "0"). As such, there is contention, but transistor 356 is sized to enable $V_{pwr}$ 354 to pull output 362 to the voltage source or a high voltage (e.g., logic "1").

The PFET logic inverter circuit 350 includes PFET transistors 356 and 358. The source of transistor 356 is coupled with $V_{pwr}$, 354 while its gate is an input 352. The $V_{pwr}$ 354 can be a voltage supply and/or a high voltage (e.g., logic "1"). The drain of transistor 356 is coupled with output 362 and to the source of transistor 358. The gate and drain of transistor 358 are each coupled with $V_{gnd}$ 360 which can be at ground and/or a low voltage (e.g., logic "0").

Figure 4A:
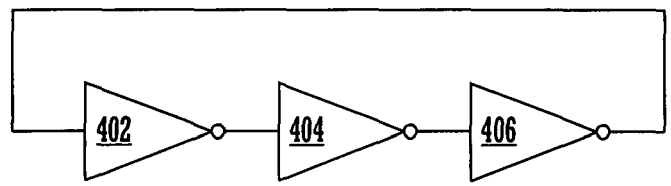
FIG. 4A is a schematic of an exemplary NFET ring oscillator circuit in accordance with embodiments of the invention.

FIG. 4A is a schematic of an exemplary NFET ring oscillator circuit 400 in accordance with embodiments of the invention. It is appreciated that NFET ring oscillator circuit 400 can be utilized as an implementation for NFET ring oscillator 104 of FIGS. 1 and 2. The NFET ring oscillator circuit 400 includes NFET logic inverter circuits 402, 404, and 406 that are coupled in series. Specifically, an output terminal of inverter circuit 402 is coupled with an input terminal of inverter circuit 404. Additionally, an output terminal of inverter circuit 404 is coupled with an input terminal of inverter circuit 406. An output terminal of inverter circuit 406 is fed back and coupled with an input terminal of inverter circuit 402. Note that NFET ring oscillator circuit 400 can be implemented in a wide variety of ways. For example, the NFET ring oscillator circuit 400 can be implemented with a greater number of logic inverter circuits than that shown in FIG. 4A.

Figure 4B:
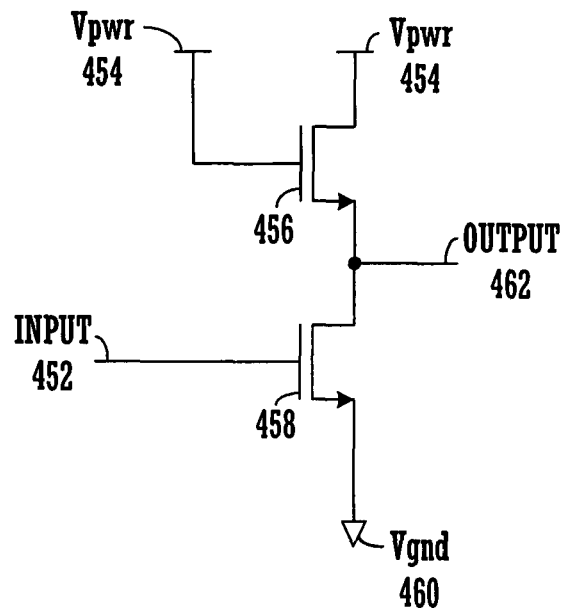
FIG. 4B is a schematic of an exemplary NFET inverter circuit in accordance with embodiments of the invention.

FIG. 4B is a schematic of an exemplary NFET logic inverter circuit 450 in accordance with embodiments of the invention. It is understood that NFET logic inverter circuit 450 can be utilized as an implementation for each of NFET logic inverter circuits 402, 404, and 406 of FIG. 4A. It is appreciated that transistor 456 is on or active. As such, when a low voltage (e.g., logic "0") is driven into input 452, transistor 458 is turned off. As such, $V_{pwr}$ 454 pulls output 462 to the voltage source or a high voltage (e.g., logic "1"). Conversely, when a high voltage (e.g., logic "1") is driven into input 452, transistor 458 is turned on (or activated) and $V_{gnd}$ 460 pulls output 462 to ground or a low voltage (e.g., logic "0") even though the activated transistor 456 is trying to pull output 462 towards the voltage source or a high voltage (e.g., logic "1"). As such, there is contention, but transistor 458 is sized to enable $V_{gnd}$ 460 to pull output 462 to ground or a low voltage (e.g., logic "0").

The NFET logic inverter circuit 450 includes NFET transistors 456 and 458. The drain and gate of transistor 456 are each coupled with $V_{pwr}$ 454 while its source is coupled with output 462 and the drain of transistor 458. The $V_{pwr}$ 454 can be a voltage supply and/or a high voltage (e.g., logic "1"). The gate of transistor 456 is an input 452 while its source is coupled with $V_{gnd}$ 460 which can be at ground and/or a low voltage (e.g., logic "0").

FIG. 5 is a flowchart of a method 500 in accordance with embodiments of the invention for controlling impedance of an output driver (or stage). Although specific operations are disclosed in method 500, such operations are exemplary. That is, method 500 may not include all of the operations illustrated by FIG. 5. Alternatively, method 500 may include various other operations and/or variations of the operations shown by FIG. 5. Likewise, the sequence of the operations of method 500 can be modified. It is noted that the operations of method 500 can each be performed by software, by firmware, by hardware, or by any combination thereof.

Specifically, a NFET ring oscillator module can be utilized to determine a NFET process corner of an integrated circuit as fabricated that includes the NFET ring oscillator module. Additionally, a PFET ring oscillator module can be utilized to determine a PFET process corner of the integrated circuit as fabricated that includes the PFET ring oscillator module. The impedance of an output driver of the integrated circuit can be adjusted based on the NFET process corner and/or the PFET process corner. In this manner, method 500 can control the impedance of the output driver (or stage).

At operation 502 of FIG. 5, a NFET ring oscillator module (e.g., 104) can be utilized to determine a NFET process corner of an integrated circuit (e.g., 100 or 200) as fabricated that includes the NFET ring oscillator module. It is appreciated that operation 502 can be implemented in a wide variety of ways. For example, the NFET ring oscillator module can include one or more inverter circuits (e.g., 450) that can each include a first NFET (e.g., 456) coupled in series with a second NFET (e.g., 458). In another embodiment, a frequency of oscillation can be measured of the NFET ring oscillator module as part of determining the NFET process corner. Furthermore, the frequency of oscillation of the NFET ring oscillator module can be compared to one or more limits (e.g., 202 and/or 204) to determine the NFET process corner. Alternatively, the frequency of oscillation of the NFET ring oscillator module can be compared to a lookup table to determine the NFET process corner. It is appreciated that operation 502 can be implemented in any manner similar to that described herein, but is not limited to such.

At operation 504, a PFET ring oscillator module (e.g., 102) can be utilized to determine a PFET process corner of the integrated circuit (e.g., 100 or 200) as fabricated that includes the PFET ring oscillator module. It is understood that operation 504 can be implemented in a wide variety of ways. For example, the PFET ring oscillator module can include one or more inverter circuits (e.g., 350) that can each include a first PFET (e.g., 356) coupled in series with a second PFET (e.g., 358). In another embodiment, a frequency of oscillation can be measured of the PFET ring oscillator module as part of determining the PFET process corner. Moreover, the frequency of oscillation of the PFET ring oscillator module can be compared to one or more limits (e.g., 212 and/or 214) to determine the PFET process corner. Alternatively, the frequency of oscillation of the PFET ring oscillator module can be compared to a lookup table to determine the PFET process corner. It is appreciated that operation 504 can be implemented in any manner similar to that described herein, but is not limited to such. Note that operations 502 and 504 can occur concurrently or simultaneously.

At operation 506 of FIG. 5, the impedance of an output driver (e.g., 164 or 226) of the integrated circuit can be adjusted (or altered or changed or modified) based on the determined NFET process corner and/or the determined PFET process corner. It is appreciated that operation 506 can be implemented in a wide variety of ways. For example, the adjusting of the impedance of the output driver at operation 506 can include issuing one or more digital signals (e.g., 132, 142, 225, and/or 232) based on the determined NFET process corner and/or the determined PFET process corner of the integrated circuit as fabricated. It is appreciated that operation 506 can be implemented in any manner similar to that described herein, but is not limited to such. At the completion of operation 506, process 500 can be exited.

FIG. 6 is a flowchart of a method 600 in accordance with embodiments of the invention for controlling impedance of an output driver (or stage). Although specific operations are disclosed in method 600, such operations are exemplary. That is, method 600 may not include all of the operations illustrated by FIG. 6. Alternatively, method 600 may include various other operations and/or variations of the operations shown by FIG. 6. Likewise, the sequence of the operations of method 600 can be modified. It is noted that the operations of method 600 can each be performed by software, by firmware, by hardware, or by any combination thereof.

Specifically, a ring oscillator module can be utilized to determine a process corner of an integrated circuit as fabricated that includes the ring oscillator module. The impedance of an output driver of the integrated circuit can be altered based on the process corner of the integrated circuit as fabricated. In this manner, method 600 can control the impedance of the output driver (or stage).

At operation 602 of FIG. 6, a ring oscillator module (e.g., 102 or 104) can be utilized to determine a process corner of an integrated circuit (e.g., 100 or 200) as fabricated that includes the ring oscillator module. It is appreciated that operation 602 can be implemented in a wide variety of ways. For example, the ring oscillator module can include one or more inverter circuits (e.g., 450) that can each include a first NFET (e.g., 456) coupled in series with a second NFET (e.g., 458). Alternatively, the ring oscillator module can include one or more inverter circuits (e.g., 350) that can each include a first PFET (e.g., 356) coupled in series with a second PFET (e.g., 358). In another embodiment, a frequency of oscillation can be measured of the ring oscillator module as part of determining the process corner. Furthermore, the frequency of oscillation of the ring oscillator module can be compared to a limit (e.g., 202, 204, 212, or 214) to determine the process corner. Alternatively, the frequency of oscillation of the ring oscillator module can be compared to a lookup table to determine the process corner. It is appreciated that operation 602 can be implemented in any manner similar to that described herein, but is not limited to such.

At operation 604, the impedance of an output driver (e.g., 164 or 226) of the integrated circuit (e.g., 100 or 200) can be altered (or adjusted or modified or changed) based on the process corner of the integrated circuit as fabricated. It is understood that operation 604 can be implemented in a wide variety of ways. For example, the altering of the impedance of the output driver at operation 604 can include issuing one or more digital signals (e.g., 132, 142, 225, and/or 232) based on the determined process corner of the integrated circuit as fabricated. It is appreciated that operation 604 can be implemented in any manner similar to that described herein, but is not limited to such. At the completion of operation 604, process 600 can be exited.

Figure 7A:
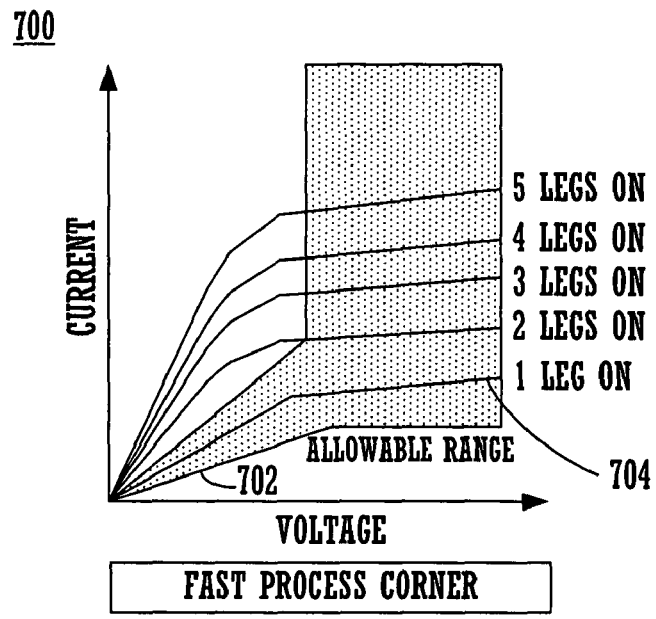
FIGS. 7A, 7B, and 7C each include an exemplary chart in accordance with embodiments of the invention that illustrate current/voltage (I/V) curves.
Figure 7B:
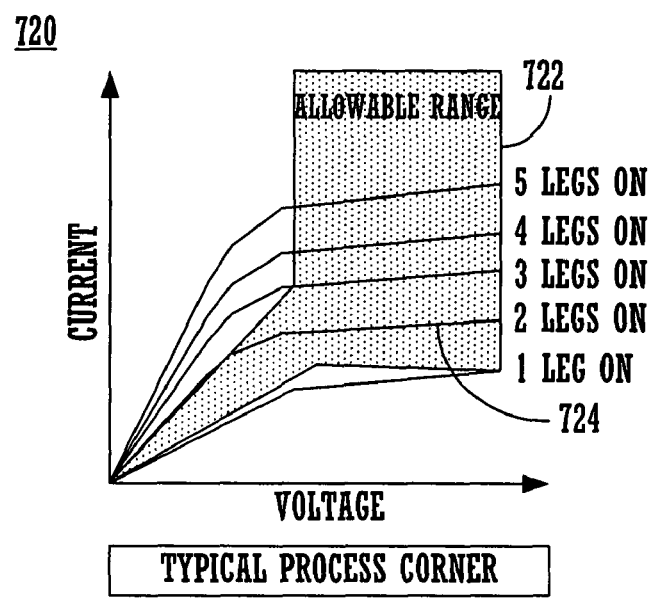
Figure 7C:
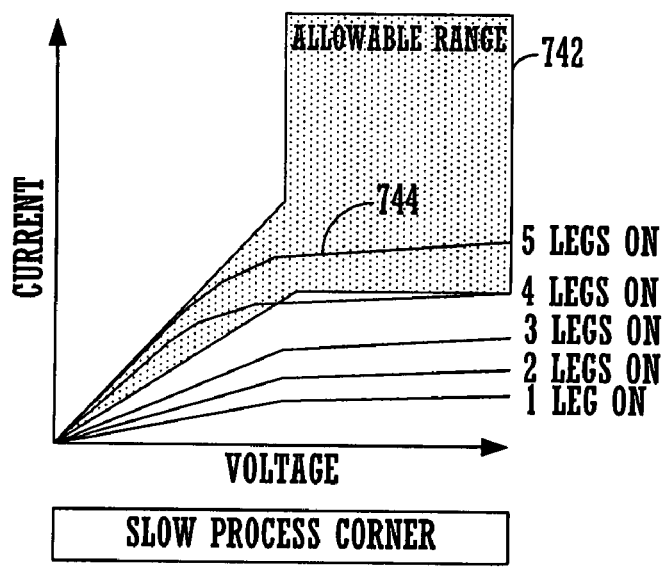

FIGS. 7A, 7B, and 7C each includes an exemplary chart in accordance with embodiments of the invention that illustrates current/voltage (I/V) curves for a five legged output stage (e.g., 164 or 226). Note that the "optimal" number of enabled legs for the five-legged output stage of each of charts 700, 720, and 740 is process dependent. For example, within chart 700 of FIG. 7A, since I/V curve 704 of a fast process corner of a circuit as fabricated is completely within allowable range 702, curve 704 corresponds to one leg of the output stage being activated in order to provide the desired output stage impedance. However, within chart 720 of FIG. 7B, since I/V curve 724 of a typical process corner of a circuit as fabricated is completely within allowable range 722, curve 724 corresponds to two legs of the output stage being activated in order to provide the desired output stage impedance. Additionally, within chart 740 of FIG. 7C, since I/V curve 744 of a slow process corner of a circuit as fabricated is completely within allowable range 742, curve 744 corresponds to five legs of the output stage being activated in order to provide the desired output stage impedance.

Therefore, it is appreciated that by utilizing an embodiment of the invention (e.g., system 100 or 200), once the process corner of the circuit (e.g., 100 or 200) as fabricated is determined or known, then the amount of legs to activate can be known in order to properly tune the impedance of an output driver (e.g., 164 or 226) of the circuit.

The foregoing descriptions of specific embodiments of the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A method comprising:
    determining an operating parameter of an integrated circuit based on a first input from an NFET ring oscillator and a second input from a PFET ring oscillator, wherein the integrated circuit includes an output driver; and
    altering an output impedance of the output driver based on the operating parameter, wherein said determining the operating parameter and said altering the output impedance are independent of a load value, wherein the NFET ring oscillator comprises NMOS transistors and excludes PMOS transistors and wherein the PFET ring oscillator comprises PMOS transistors and excludes NMOS transistors.

2. The method of claim 1, wherein the operating parameter is associated with a process corner of the integrated circuit.

3. The method of claim 2, wherein the process corner is associated with a voltage and a temperature of the integrated circuit.

4. The method of claim 1 further comprising:
    determining a plurality of operating parameters based on an input from a plurality of ring oscillators, wherein the plurality of operating parameters are associated with a respective ring oscillator of the plurality of ring oscillators; and
    altering the output impedance of the output driver based on the plurality of operating parameters.

5. The method of claim 4, wherein the plurality of operating parameters comprise an NFET process corner and a PFET process corner.

6. An apparatus comprising:
    a plurality of ring oscillators, wherein the ring oscillators include an NFET ring oscillator and a PFET ring oscillator; and
    at least one component coupled to the plurality of ring oscillators, wherein the at least one component is configured to determine an operating parameter of an integrated circuit based on a first input from the NFET ring oscillator and a second input from the PFET ring oscillator, wherein the integrated circuit includes an output driver, wherein the at least one component is further configured to alter an output impedance of the output driver based on the operating parameter, and wherein the at least one component is further configured to determine the operating parameter and to alter the output impedance independently of a load value, wherein the NFET ring oscillator comprises NMOS transistors and excludes PMOS transistors and wherein the PFET ring oscillator comprises PMOS transistors and excludes NMOS transistors.

7. The apparatus of claim 6, wherein the operating parameter is associated with a process corner of the integrated circuit.

8. The apparatus of claim 7, wherein the process corner is associated with a voltage and a temperature of the integrated circuit.

9. The apparatus of claim 6, wherein the operating parameter comprises an NFET process corner.

10. The apparatus of claim 6, wherein the operating parameters comprises a PFET process corner.

11. A device comprising:
    an integrated circuit including:
        an output driver; and
        a control component coupled to the output driver, wherein the control component includes:
            a plurality of ring oscillators, wherein the ring oscillators include an NFET ring oscillator and a PFET ring oscillator; and
            at least one component coupled to the plurality of ring oscillators, wherein the at least one component is configured to determine an operating parameter of the integrated circuit based on a first input from the NFET ring oscillator and a second input from the PFET ring oscillator, wherein the at least one component is further configured to alter an output impedance of the output driver based on the operating parameter, and wherein the at least one component is further configured to determine the operating parameter and to alter the output impedance independently of a load value, wherein the NFET ring oscillator comprises NMOS transistors and excludes PMOS transistors and wherein the PFET ring oscillator comprises PMOS transistors and excludes NMOS transistors.

12. The device of claim 11, wherein the operating parameter is associated with a process corner of the integrated circuit.

13. The device of claim 12, wherein the process corner is associated with a voltage and a temperature of the integrated circuit.

14. The device of claim 11, wherein the operating parameter comprises an NFET process corner.

15. The device of claim 11, wherein the operating parameters comprises a PFET process corner.

16. A system comprising:
    means for determining an operating parameter of an integrated circuit based on a first input from an NFET ring oscillator and a second input from a PFET ring oscillator, wherein the integrated circuit includes an output driver; and means for altering an output impedance of the output driver based on the operating parameter, wherein the means for determining the operating parameter and the means for altering the output impedance operate independently of a load value, wherein the NFET ring oscillator comprises NMOS transistors and excludes PMOS transistors and wherein the PFET ring oscillator comprises PMOS transistors and excludes NMOS transistors.

17. The system of claim 16, wherein the operating parameter is associated with a process corner of the integrated circuit.

18. The system of claim 17, wherein the process corner is associated with a voltage and a temperature of the integrated circuit.

19. The system of claim 16,
wherein the operating parameter comprises an NFET process corner.

20. The system of claim 16, wherein the operating parameters comprises a PFET process corner.

21. An integrated circuit comprising:
a plurality of ring oscillators, wherein the ring oscillators include an NFET ring oscillator and a PFET ring oscillator;
an output driver; and
at least one component coupled to the plurality of ring oscillators and the output driver, wherein the at least one component is configured to determine an operating parameter of the integrated circuit based on a first input from the NFET ring oscillator and a second input from the PFET ring oscillator, wherein the at least one component is further configured to alter an output impedance of the output driver based on the operating parameter, and wherein the at least one component is further configured to determine the operating parameter and to alter the output impedance independently of a load value, wherein the NFET ring oscillator comprises NMOS transistors and excludes PMOS transistors and wherein the PFET ring oscillator comprises PMOS transistors and excludes NMOS transistors.

22. The integrated circuit of claim 21 further comprising:
a plurality of measurement components coupled to the plurality of ring oscillators, wherein the measurement components are configured to measure a respective oscillation frequency for a respective ring oscillator from the plurality of ring oscillators.

23. The integrated circuit of claim 21, wherein the at least one component is implemented using at least one hardware component.

24. The integrated circuit of claim 21, wherein the at least one component is implemented using at least one software component.

25. The integrated circuit of claim 21, wherein the output driver comprises a pull-up structure and a pull-down structure.

26. The integrated circuit of claim 21, wherein the operating parameter is associated with a process corner of the integrated circuit.

27. The integrated circuit of claim 26, wherein the process corner is associated with a voltage and a temperature of the integrated circuit.

* * * * *

UNITED STATES PATENT AND TRADEMARK OFFICE
CERTIFICATE OF CORRECTION

| | | |
|---|---|---|
| PATENT NO. | : 7,889,014 B1 | |
| APPLICATION NO. | : 11/986337 | |
| DATED | : February 15, 2011 | |
| INVENTOR(S) | : Stoiber et al. | |

It is certified that error appears in the above-identified patent and that said Letters Patent is hereby corrected as shown below:

Column 18, lines 29-30, in Claim 10, delete "parameters" and insert -- parameter --.

Column 18, lines 63-64, in Claim 15, delete "parameters" and insert -- parameter --.

Column 19, lines 21-22, in Claim 20, delete "parameters" and insert -- parameter --.

Signed and Sealed this
Seventh Day of June, 2011

David J. Kappos
*Director of the United States Patent and Trademark Office*